United States Patent
Sendaula et al.

(10) Patent No.: US 6,982,502 B1
(45) Date of Patent: Jan. 3, 2006

(54) HYBRID ELECTRIC LINEAR ACTUATOR

(75) Inventors: Musoke H. Sendaula, Helotes, TX (US); Joseph P. Teter, Mt. Airy, MD (US); David J. Brady, Marlton, NJ (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 119 days.

(21) Appl. No.: 10/672,267

(22) Filed: Sep. 26, 2003

(51) Int. Cl.
*H02N 2/00* (2006.01)
*H02K 41/03* (2006.01)

(52) U.S. Cl. .................. 310/26; 310/12; 192/84.1; 192/84.2; 188/161; 188/72.1

(58) Field of Classification Search ............. 310/26, 310/12, 14, 328; 188/161, 72.1; 192/84.1, 192/84.2, 84.3
See application file for complete search history.

(56) References Cited

U.S. PATENT DOCUMENTS

| | | | | |
|---|---|---|---|---|
| 5,389,845 A | * | 2/1995 | Brimhall | 310/26 |
| 5,602,434 A | * | 2/1997 | Riedl | 310/26 |
| 5,705,863 A | | 1/1998 | Teter | 310/26 |
| 6,294,849 B1 | | 9/2001 | Teter | 310/26 |
| 6,737,776 B1 | * | 5/2004 | Teter | 310/78 |
| 6,830,141 B1 | * | 12/2004 | Neelakantan et al. | 192/84.6 |

* cited by examiner

*Primary Examiner*—Karl Tamai
(74) *Attorney, Agent, or Firm*—Jacob Shuster

(57) ABSTRACT

A hybrid linear actuator features a central load shaft on which a plurality of solid-state magnetostrictive thrusters are positioned in operative relation to electric motors of a permanent magnet synchronous type to impart linear thrust force to the load shaft through clutch units also positioned thereon and under control of force and stroke amplification of output force from motor shafts projecting from the motors.

9 Claims, 3 Drawing Sheets

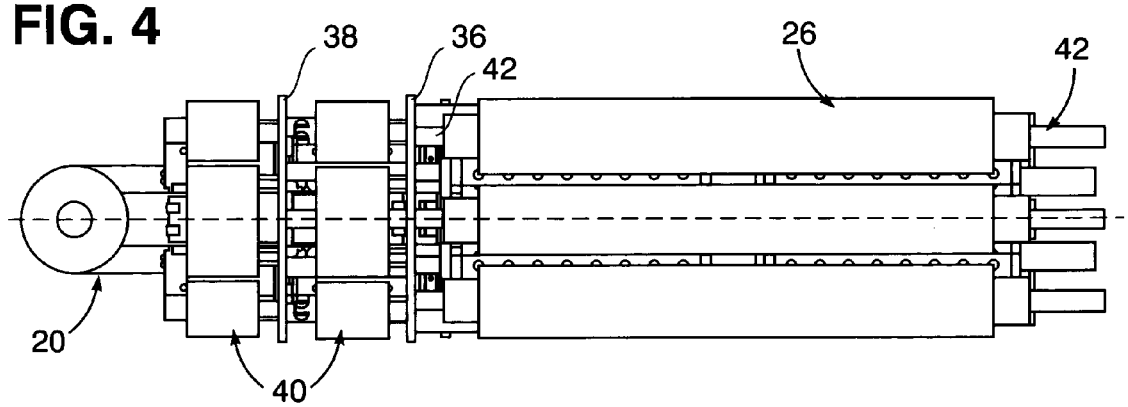
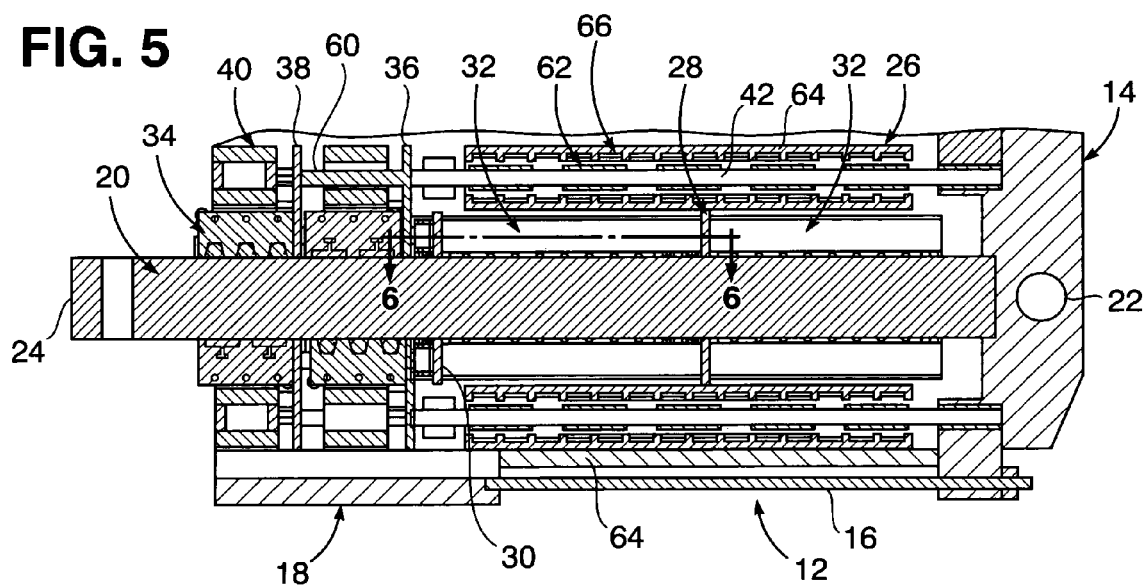
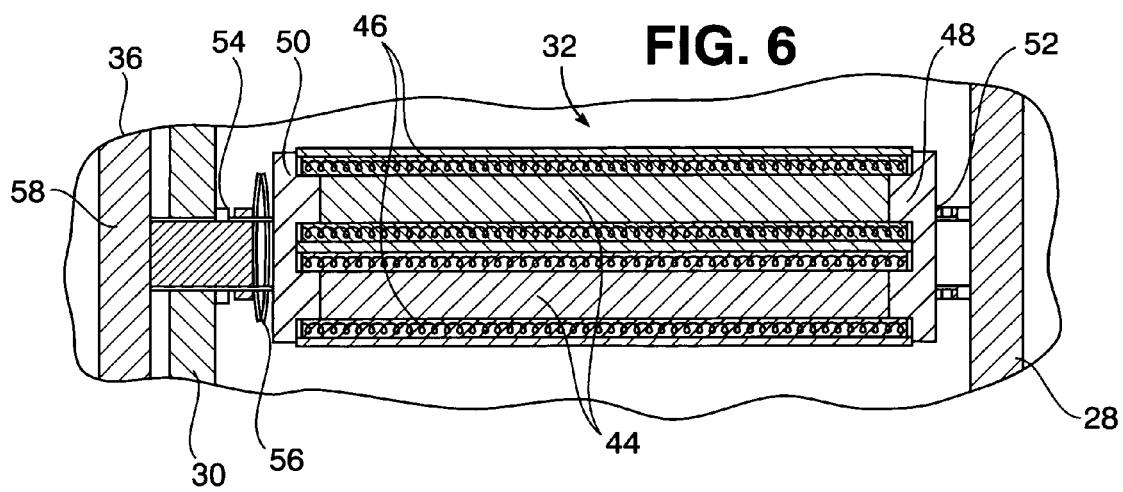

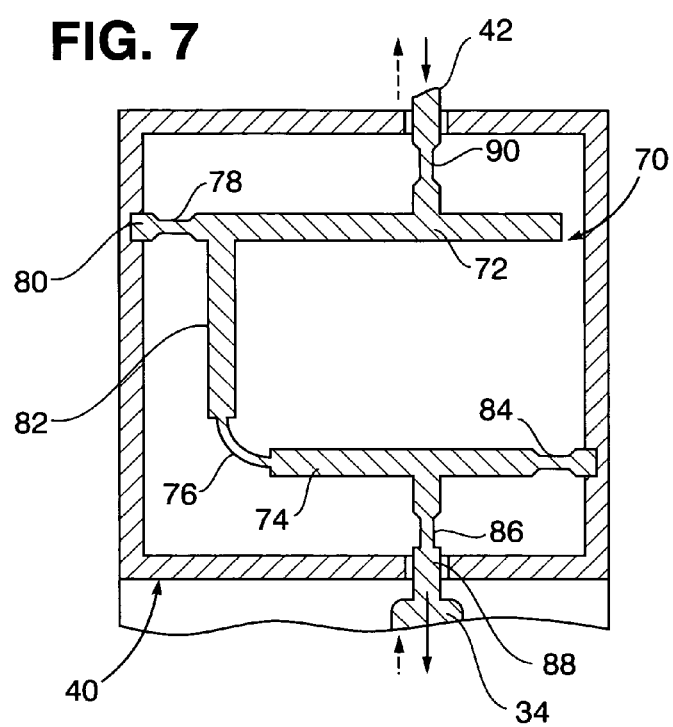

HYBRID ELECTRIC LINEAR ACTUATOR

The present invention relates to a high thrust force producing actuator.

BACKGROUND OF THE INVENTION

High powered, long stroke linear actuators as generally known in the art involve use of solid-state thrusters, motors, self-activating clutches and compliant gearing. Such actuators are disclosed for example in U.S. Pat. Nos. 5,705,863 and 6,294,849, featuring methods of enhancing operation of a magnetostrictive type of motor to minimize and limit stroke impact.

Because hydraulic cylinder type linear actuators heretofore utilized have a low power density, attempts have been made to replace such hydraulic actuators with electromechanical types of linear actuators with higher power density without success because of reliability and scaling problems with power screws. Controllability problems have also occurred with respect to the clutch units associated with linear actuators, while stroke limiting problems were heretofore associated with the use of solid-state thrusters in such linear actuators. It is therefore an important object of the present invention to provide a linear force applying actuator involving the beneficial use of electric magnetostrictive types of motors and solid-state thrusters with clutch units having associated facilities to deal with load inertia and control stroke while avoiding the other aforementioned problems heretofore associated with linear actuators.

SUMMARY OF THE INVENTION

Pursuant to the present invention, a hybrid actuator capable of imparting a linear drive force to a load is provided with both solid-state thrusters and electric linear motors through which such drive force is generated and applied in opposite directions to the load through sets of clutch units under control of compliant stroke and force amplification devices. The arrangement and construction of components forming the hybrid actuator is such as to accommodate control over drive force speed and stroke length in accordance with cyclic variations in clutch operation. As to the component constructions, the solid-state thrusters may feature use of magnetostrictive rods and stacks and high force generating linear electric motors of a permanent magnet synchronous type.

DESCRIPTION OF DRAWING

A more complete appreciation of the invention and many of its attendant advantages will be readily appreciated as the same becomes better understood by reference to the following detailed description when considered in connection with the accompanying drawing wherein:

FIG. 4 is a side elevation view of the actuator illustrated in FIG. 1, with outer housing sections thereof removed;

FIG. 5 is a longitudinal section view taken substantially through a plane indicated by section line 5—5 in FIG. 3;

FIG. 6 is an enlarged partial section view taken substantially through a plane indicated by section line 6—6 in FIG. 5; and FIG. 7 is a partial section view taken substantially through a plane indicated by section line 7—7 in FIG. 2.

DETAILED DESCRIPTION OF THE PREFERRED EMBODIMENT

Figure 1:
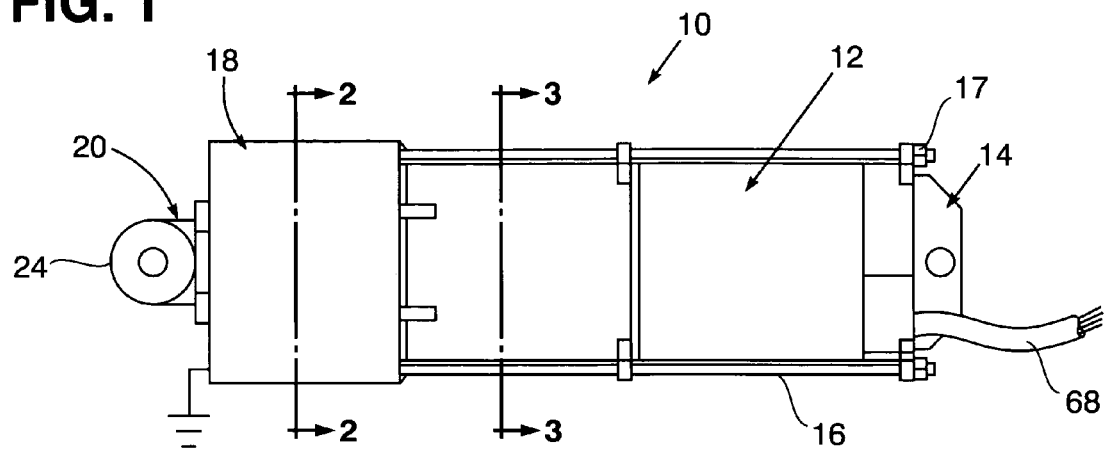
FIG. 1 is a side elevation view of a hybrid linear actuator constructed in accordance with one embodiment of the present invention.

Referring now to the drawing in detail, FIG. 1 illustrates a hybrid actuator 10 having an axially elongated housing section 12 adapted to be fixedly anchored at one axial end by a mounting piece 14. A pair of elongated, parallel-spaced bolts 16 with nuts 17 on the ends thereof interconnect the housing section 12 with a somewhat larger housing section 18 at the other axial end of the hybrid actuator 10 from which an actuating shaft 20 projects for attachment to a load to be driven.

Figure 2:
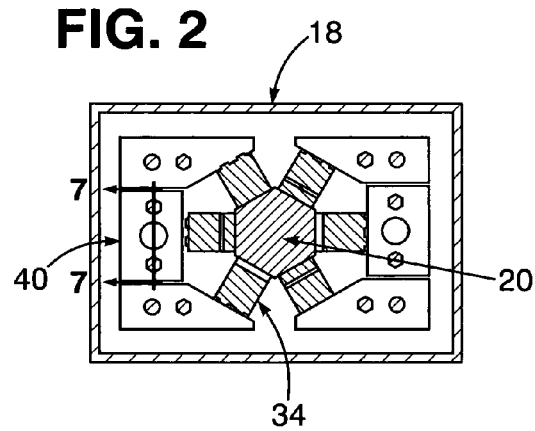
FIGS. 2 and 3 are transverse section views taken substantially through planes indicated by section lines 2—2 and 3—3 in FIG. 1.
Figure 3:
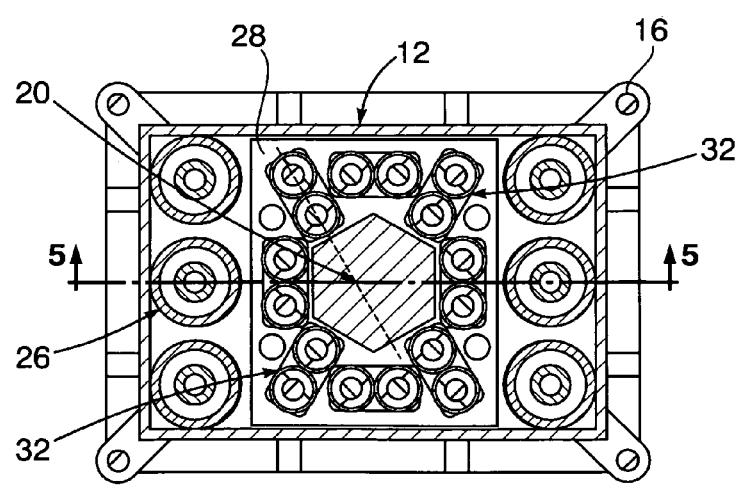

As shown in FIGS. 2 and 3, the shaft 20 is of a dimensionally constant, six-sided cross-sectional shape extending throughout the actuator 10 between axial shaft end 22 and axial shaft end 24 at which the shaft 20 is attachable to the load for imparting a drive force thereon. Positioned within the actuator housing section 12, which is of rectangular cross-sectional shape as shown in FIG. 3, are six tubular motors 26 of a linear synchronous permanent magnet type. Such motors 26 are disposed in radially spaced relation to the shaft 20 on opposite lateral sides thereof within the housing section 12. Also disposed within the housing section 12 about the shaft 20 are sets of sixteen magnetostrictive thrusters 32 as shown in FIG. 3.

Referring now to FIG. 2, disposed within the housing section 18 in engagement each of the six (6) planar sides of the shaft 20 are clutch units 34. Also located within the housing section 18 are gear boxes 40 within which a force and stroke magnification mechanism is provided for engagement with the clutch units when driven by the motors 26 as hereinafter explained.

FIG. 4 illustrates the hybrid actuator 10 corresponding to that shown in FIG. 1 with the housing sections 12 and 18 removed together with their associated attachment bolts 16 and mounting piece 14, thereby exposing the motors 26 and the gear boxes 40. Also shown exposed are two clutch plates 36 and 38 through which motor output shafts 42 from the motors 26 extend into the gear boxes 40 to control the clutch units 34.

With reference to FIGS. 3 and 5, the two sets of eight magnetostrictive thrusters 32 are shown positioned along the shaft 20 with associated thrust plates 28 and 30 at the axial ends of each set of thrusters 32 through which thrust forces are transmitted to the clutch plates 36 and 38. The thrusters 32 are located on the planar surfaces of the shaft 20, radially spaced from the motors 26 so that the motor output shafts 42 may transfer forces to the clutch units 34 amplified by mechanisms 70 within the gear boxes 40 as shown in FIG. 7.

Referring now to FIG. 6, one embodiment of the magnetostrictive thrusters 32 is illustrated, which may be utilized in the hybrid actuator 10 as hereinbefore described. Such a thruster 32 includes two magnetostrictive rods 44 respectively disposed within a pair of excitation coils 46 extending axially between magnetic yokes 48 and 50 to complete a magnetic circuit. The two coils 46 are wound so that the magnetic flux therefrom is additive to reduce the required coil size. A positioning screw nut 52 holds the yoke 48 attached to the thrust plate 28 which is electrically grounded through the housing section 16, while a positioning screw nut 54 holds Belleville spring 56 in position abutting the yoke 50 to pre-stress the thruster rods 44 between the electrically grounded plates 28 and 30. A thruster piston 58 extends from the yoke 50 through the thrust plate 30 to the clutch plate 36 interconnected by links 60 as shown in FIG. 5 to the other clutch plate 38.

Each of the motors 26 as shown in FIG. 5 includes permanent ring magnets 62 positioned in axially spaced relation to each other on the motor shaft 42 within an outer non-magnetic tubular body 64. Multi-phase windings 66 are positioned within the motor body 64. Operation of such motor 26 occurs in response to electrical current supplied to the windings 66 from an external power source through cable 68 as shown in FIG. 2, for transmission of electrical energy to the excitation coils 46 of the thrusters 32 and motor windings 66 for imparting linear drive forces through the clutch units 34 to the shaft 20 under control of mechanisms within the gear boxes 40.

According to the embodiment as illustrated in FIG. 7, the force and stroke amplification mechanism 70 enclosed within the gear box 40 embodies a pair of lever links 72 and 74 interconnected with each other by a flexural pivot 76. The link 72 is connected at one end by a flexural pivot 78 to an anchor 80 fixed to the gear box 40 housing so as to act as a force amplifying lever. The link 74 is also anchored to the gear box housing through a flexure pivot 84 and is connected by the flexural pivot 76 and an output link 82 to the input lever link 72. The link 74 thereby operating as an output lever is connected through an output flexure pivot 86 and an output element 88 to the clutch unit 34 to transmit output force thereto. Input force is applied from the motor shaft 42 through a flexure pivot 90 to the input lever 72. The foregoing configuration of the mechanism 70 magnifies force or stroke without changing direction of the input force transmitted from the motors 26 to the clutches 34 in the arrangement of the present invention as hereinbefore described.

From the foregoing description it will be apparent that speed of load displacement by the actuator 10 may be controlled by adjustment of both the total thrust force applied to the shaft 20 from the magnetostrictive thrusters 32 and the linear motors 26 by change in the number of operational cycle phases and cycle length associated with the drive clutch units 34. By imposition of more stress on the clutch units 34, length of their operational cycle may be further increased to increase load speed.

In the embodiment of the present invention hereinbefore described, two sets of six drive clutch units 34 are associated with the six motors 26 of the tubular linear permanent magnet synchronous type so that forces derived from each set of three motors 26 will evenly drive both set of six clutch units 34, through the mechanisms 70 in the gear boxes 40 under control of the linear motors 26. When such motors 26 are driven by the load, they become generators to provide regenerative braking or energize the magnetostrictive thrusters 32 to assist in controllable reactions of the shaft 20.

Obviously, other modifications and variations of the present invention may be possible in light of the foregoing teachings. It is therefore to be understood that within the scope of the appended claims the invention may be practiced otherwise than as specifically described.

What is claimed is:

1. A hybrid actuator through which a linear drive is applied to a load, comprising: an actuator shaft connected to the load; a plurality of electrically energized motors positioned over the shaft; a plurality of solid-state thrusters positioned on the actuator shaft in operative relation to the motors; clutch means mounted on the actuator shaft in engagement with the thrusters for transfer of thrust force to the actuator shaft during operation in response to energization of the motors; and amplification means for amplifying force and stroke output of said motors to cyclically control said operation of the clutch means and effect said drive of the load.

2. The hybrid actuator as defined in claim 1, wherein said clutch means comprises: a plurality of self-locking clutch units positioned on the actuator shaft in angularly spaced relation to each other.

3. The hybrid actuator as defined in claim 2, wherein said amplification means amplifies the thrust force transferred to the shaft during compliant strokes under directional control of the clutch means.

4. The hybrid actuator as defined in claim 3, wherein each of said solid-state thrusters includes: magnetostrictive rods on which coils are mounted.

5. The hybrid actuator as defined in claim 4, wherein each of the motors includes: a motor shaft in axial engagement with the amplification means; a plurality of permanent magnets positioned on the motor shaft; and motor winding coils electrically connected to a power source and operatively positioned about the motor shaft over the permanent magnets.

6. The hybrid actuator as defined in claim 1, wherein said amplification means amplifies the thrust force transferred to the shaft during compliant strokes under directional control of the clutch means.

7. The hybrid actuator as defined in claim 1, wherein each of said solid-state thrusters includes: magnetostrictive rods on which coils are mounted.

8. The hybrid actuator as defined in claim 1, wherein each of the motors includes: a motor shaft; a plurality of permanent magnets positioned on the motor shaft; and motor winding coils electrically connected to a power source and operatively positioned about the motor shaft over the permanent magnets.

9. The hybrid actuator as defined in claim 2, wherein said actuator shaft has a cross-section forming planar surfaces on which the clutch units are respectively positioned.

* * * * *